(12) United States Patent
Chung et al.

(10) Patent No.: US 8,305,790 B2
(45) Date of Patent: Nov. 6, 2012

(54) ELECTRICAL ANTI-FUSE AND RELATED APPLICATIONS

(75) Inventors: Tao-Wen Chung, Zhubei (TW); Po-Yao Ke, Dashe Township (TW); Shine Chung, San Jose, CA (US); Fu-Lung Hsueh, Cranbury, NJ (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 297 days.

(21) Appl. No.: 12/724,556

(22) Filed: Mar. 16, 2010

(65) Prior Publication Data

US 2010/0232203 A1  Sep. 16, 2010

Related U.S. Application Data

(60) Provisional application No. 61/160,494, filed on Mar. 16, 2009.

(51) Int. Cl.
*G11C 17/00* (2006.01)

(52) U.S. Cl. .. 365/96; 365/225.7; 365/104; 365/185.01; 365/185.26

(58) Field of Classification Search ............. 365/96, 365/225, 104, 185.01, 185.26
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 | 1/2003 | Matsuda et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |

(Continued)

FOREIGN PATENT DOCUMENTS

CN  101179046  5/2005

(Continued)

OTHER PUBLICATIONS

Shikida, Mitsuhiro, et al., "Comparison of Anisotropic Etching Properties Between KOH and TMAH Solutions", IEEE Xplore, Jun. 30, 2010, pp. 315-320.

(Continued)

*Primary Examiner* — Thong Q Le
(74) *Attorney, Agent, or Firm* — Lowe Hauptman Ham & Berner, LLP (57) ABSTRACT

A first terminal and a second terminal of a FinFET transistor are used as two terminals of an anti-fuse. To program the anti-fuse, a gate of the FinFET transistor is controlled, and a voltage having a predetermined amplitude and a predetermined duration is applied to the first terminal to cause the first terminal to be electrically shorted to the second terminal.

23 Claims, 5 Drawing Sheets

U.S. PATENT DOCUMENTS

| | | |
|---|---|---|
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0234422 A1 | 12/2003 | Wang et al. |
| 2004/0192067 A1 | 9/2004 | Ghyselen et al. |
| 2004/0259315 A1 | 12/2004 | Sakaguchi et al. |
| 2005/0020020 A1 | 1/2005 | Collaert et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091937 A1 | 5/2006 | Do |
| 2006/0105557 A1 | 5/2006 | Klee et al. |
| 2006/0128071 A1* | 6/2006 | Rankin et al. ............ 438/131 |
| 2006/0138572 A1 | 6/2006 | Arikado et al. |
| 2006/0151808 A1 | 7/2006 | Chen et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| WO | WO2007/115585 | 10/2007 |

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Anathan, Han, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d., 2004.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "Speedie: A Profile Simulator for Etching and Deposition", Proc. SPIE 1392, 126 (1991).

90 nm Technology. retrieved from the Internet <URL:http://tsmc.com/english/dedicatedFoundry/technology/90nm.htm, 2004.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

* cited by examiner

ELECTRICAL ANTI-FUSE AND RELATED APPLICATIONS

CROSS-REFERENCE TO RELATED APPLICATIONS

The present application claims priority of U.S. application Ser. No. 61/160,494, filed on Mar. 16, 2009, the disclosure of which is hereby incorporated by reference in its entirety.

This application is related to U.S. patent application Ser. Nos. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present disclosure is related to electrical anti-fuses. In various embodiments, a fuse uses FinFET (Fin Field Effect Transistor) MOS (Metal-Oxide-Silicon) technology and is used in OTP (one-time programmable) memory.

BACKGROUND

As the size of planar transistors has been steadily decreased, they are expected to suffer from undesirable short channel effects, especially in 32 nm and smaller technologies.

An OTP (one-time programmable) memory in MOS (Metal Oxide Silicon) generally takes advantages of thin-oxide breakdown, but experiences disadvantages, including unreliability for production. Because the heat generated in a P/N junction can easily be dissipated in a planar structure, spikes in the P/N junction that can be shorted due to dopant migration or inter-diffusion of the contact alloy require an extreme high current, such as an ESD zap, to reliably break the junction. Spikes usually result from a P/N junction being reverse-biased for a long time. An approach tying the gate to the drain and applying a high voltage to the source for using MOS as OTP is also unreliable.

BRIEF DESCRIPTION OF THE DRAWINGS

The details of one or more embodiments are set forth in the accompanying drawings and the description below. Various features are not drawn to scale and are used for illustration purposes only. The numbers and dimensions of various features may be arbitrarily increased or reduced for clarity of discussion. Other features and advantages of embodiments of the invention will be apparent from the description, drawings, and claims. Like reference numerals in the drawings denote like elements.

DETAILED DESCRIPTION

Embodiments, or examples, illustrated in the drawings are now being described using specific languages. It will nevertheless be understood that the embodiments and examples are not intended to be limiting. Any alterations and modifications in the disclosed embodiments, and any further applications of principles of the invention are contemplated as would normally occur to one of ordinary skill in the pertinent art. Reference numbers may be repeated throughout the embodiments, but do not necessarily require that feature(s) of one embodiment apply to another embodiment, even if they share the same reference number.

Fuse (Anti-Fuse)

Some embodiments disclosed herein are related to electrical anti-fuses, which can be advantageously used in an OTP memory. For simplicity, "anti-fuse" and "fuse" are used interchangeably in this application.

In one or more embodiments, a FinFET transistor is used as a (anti-) fuse, and its drain and source are considered two terminals of the fuse. In normal conditions, the transistor is not operational, its drain and source are not electrically connected. The fuse is therefore open (e.g., its terminals are electrically open). The gate of the transistor is then controlled (e.g., to turn off the transistor), and a voltage with appropriate amplitude and duration is applied to the drain of the transistor causing the drain and the source to be electrically shorted. In effect, the two terminals of the fuse are electrically shorted.

As a result, the transistor functions as an anti-fuse. In some embodiments, the fuse is used in an OTP memory array. Other embodiments and related applications are also disclosed.

Figure 1:
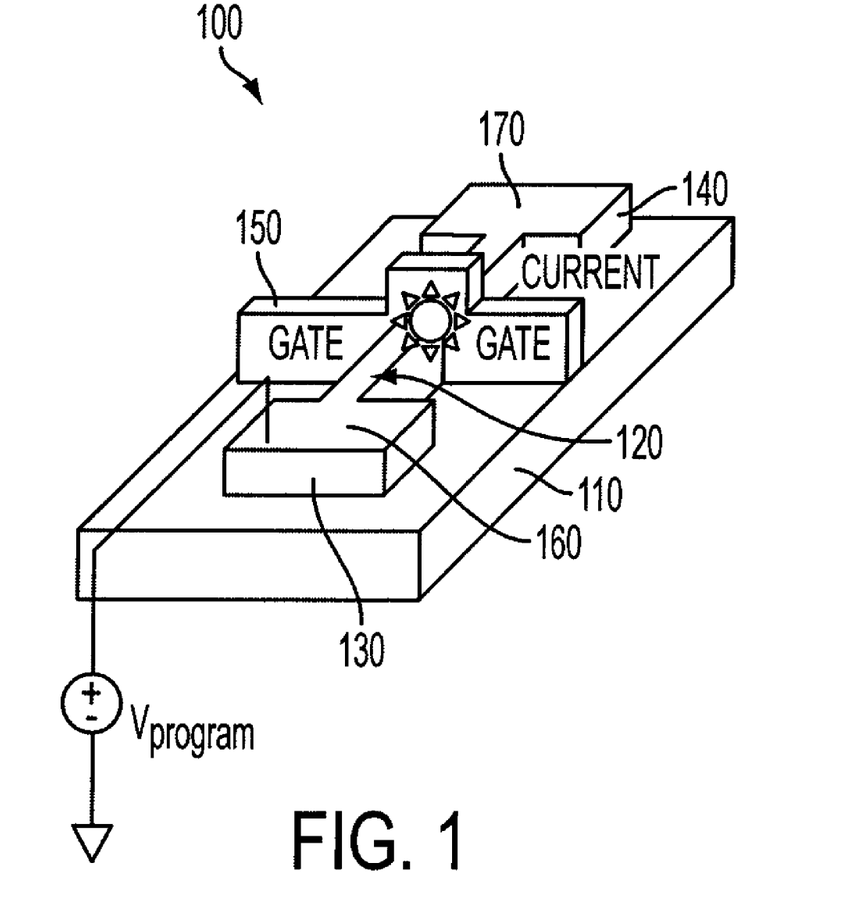
FIG. 1 is a schematic perspective view of an anti-fuse in accordance with some embodiments.
Figure 2:
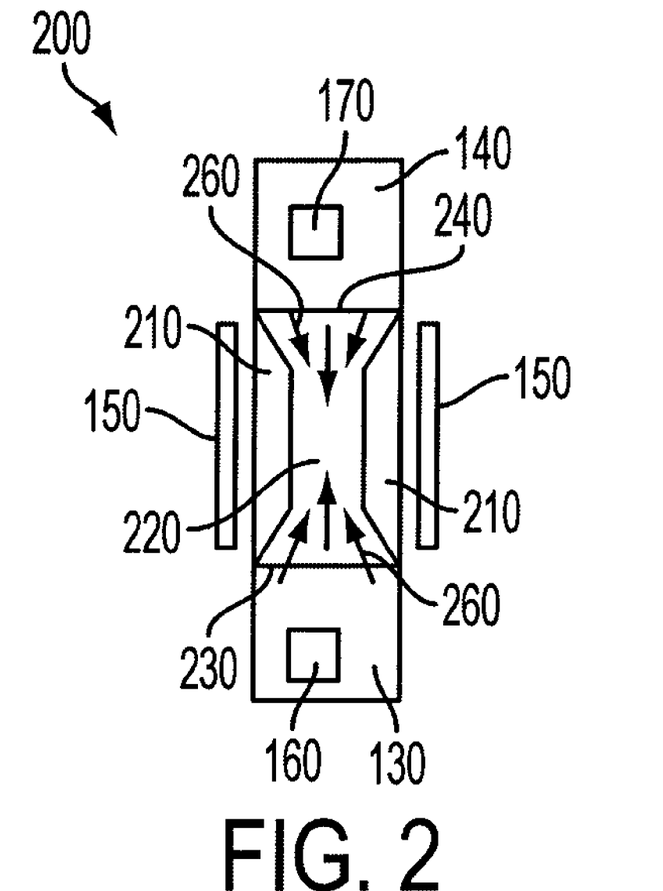
FIG. 2 is a cross section of the anti-fuse of FIG. 1.

FIG. 1 shows an anti-fuse 100 and FIG. 2 shows a cross section 200 of anti-fuse 100, in accordance with some embodiments. An anti-fuse is a fuse that is normally open (i.e., two terminals of the fuse are open circuit or high impedance). After being programmed, the two terminals of the fuse are electrically shorted allowing a current to flow between the two terminals. For simplicity, an "anti-fuse" in this application is also referred to as a "fuse."

Fuse 100 in FIG. 1 is a FinFET transistor. In the relevant description below and for illustration purposes, fuse 100 or transistor 100 are used interchangeably. Fuse (or transistor) 100 includes a substrate 110, a fin 120, a drain 130, a source 140, a gate 150, and two contact regions 160 and 170. In accordance with some embodiments, transistor 100 is symmetrical. That is, a source (e.g., source 140) can be selected to be a drain (e.g., drain 130) while a drain (e.g., drain 130) can be selected to be a source (e.g., source 140). Further, drain 130 and source 140 are used as two terminals of fuse 100.

In some embodiments, gate 150 is doped with P implants while drain 130 and source 140 are doped with N+ implants. As a result, gate 150, drain 130, and source 140 form two PN junctions 230 and 240 (FIG. 2) including one PN junction 230 from gate 150 to drain 130 and another PN junction 240 from gate 150 to source 140.

Before being programmed, transistor 100 is off, drain 130 and source 140 are open, the impedance between drain 130 and source 140 is high, and fuse 100 is in the open mode. As a result, there is no current flow between drain 130 and source 140. After being programmed, drain 130 and source 140 are electrically shorted, fuse 100 is in the closed or shorted mode.

To program fuse 100, gate 150 of fuse 100 is controlled (e.g., to turn the fuse 100 on or off) and a voltage, e.g., voltage $V_{PROGRAM}$, having appropriate amplitude and duration is applied to drain 130. In some embodiments, transistor 100 is off when the voltage at gate 150 to source 140 ($V_{GS}$ of transistor 100) is less than a threshold voltage, e.g., voltage $V_T$ that turns transistor 100 on. In an embodiment, $V_T$ for transistor 100 is about 0.4V. That is, transistor 100 is turned on at about 0.4V. As a result, when a voltage applied at gate 150 such that $V_{GS}$ is less then 0.4V, transistor 100 is off. When gate 130 is floated or applied with a negative voltage, transistor 100 is also off because $V_{GS}$ is less than $V_T$. If a voltage applied at gate 150 so that $V_{GS}$ is between about 0.1V to 0.3V, transistor 100 is said to have a minor turn-on, a depletion region 210 is generated by this "small" gate voltage, narrows channel 220 and causes drain 130 and source 140 easier to be shorted. In some embodiments, the amplitude for voltage $V_{PROGRAM}$ is in the range of 1.5-2.0V, and its programming duration is in the range of 50 to 100 microseconds (uS). Depending on implementations and variations of process technologies, the voltage to control gate 150 (to turn if off, to minor turn it on, etc.) varies. Similarly, the amplitude and duration of $V_{PROGRAM}$ also vary.

When fuse 100 is being programmed, a current spike occurs under gate 150 and a current flows from drain 130 to source 140. This is because junction breakdown occurs at junctions 230 and 240. Excess carriers are induced from drain 130 through channel 220 to source 140. Because of the high-density current that are induced from drain 130, the temperature at transistor 100 (e.g., drain 130, source 140, channel 220, etc.), significantly increases. The high temperature and current spike cause oxide breakdown at gate 150, resulting in drain 130 and source 140 to be electrically shorted. During the process, electrons 260 in contact regions 160 and 170 are removed, and electrons 260 in drain 130 are injected through gate region 150 into source region 140. In effect, gate region 150 also includes N+ implants causing an N+ channel between drain 130 and source 140.

The channel creation and short-circuit between drain 130 and source 140 described above are materialized in FinFET technology because fin 120 is thin, drain 130 and source 140 are small and isolated from substrate 110 such that a very low current can cause a spike, through the thin substrate (or body) region. As fin 120 is thin, the high temperature due to the current spike is retained in fin 120, enabling a short-circuit between drain 130 and source 140. This is a reliable and reproducible mechanism for shorting the fuse and thus enabling the use thereof in OTP. For other technologies (e.g., planar technology) without a thin fin, short-circuit between drain 130 and source 140 might not happen because the heat/temperature would dissipate among different parts of transistor 100.

In the above disclosed embodiments, applying voltage $V_{PROGRAM}$ to drain 130 shorts fuse 100. In further embodiments, applying voltage $V_{PROGRAM}$ to source 140, instead of drain 130, also shorts fuse 100. Further, FIG. 1 shows an NMOS FinFET 100, but variations and modifications are within the scope of this disclosure. For example, a PMOS instead of an NMOS FinFET is used in some embodiments to create an anti-fuse. To turn off a PMOS FinFET transistor, however, relevant mechanisms different from those for an NMOS are used, including, for example, connecting the gate of the PMOS FinFET to a positive voltage, to VDD, etc. Similarly, to minor turn on the PMOS FinFET, a negative voltage closer to the negative threshold of the PMOS FinFET is used, etc. So that a drain and a source of a PMOS FinFET are shorted, a different voltage level and/or duration is/are used to create the depletion region. This disclosure is not limited to any particular mechanism or technology.

In the FinFET embodiments, the source and the drain of the FinFET transistor being used as the fuse are small and isolated from the substrate such that only a very low current can cause a spike through the also thin body region. Further, the thin silicon width can maintain the necessary temperature when a current spike occurs. As a result, mechanisms to short the fuse are reliable and reproducible, and the fuse can advantageously be used in an OTP memory.

Memory Cell

Figure 3:
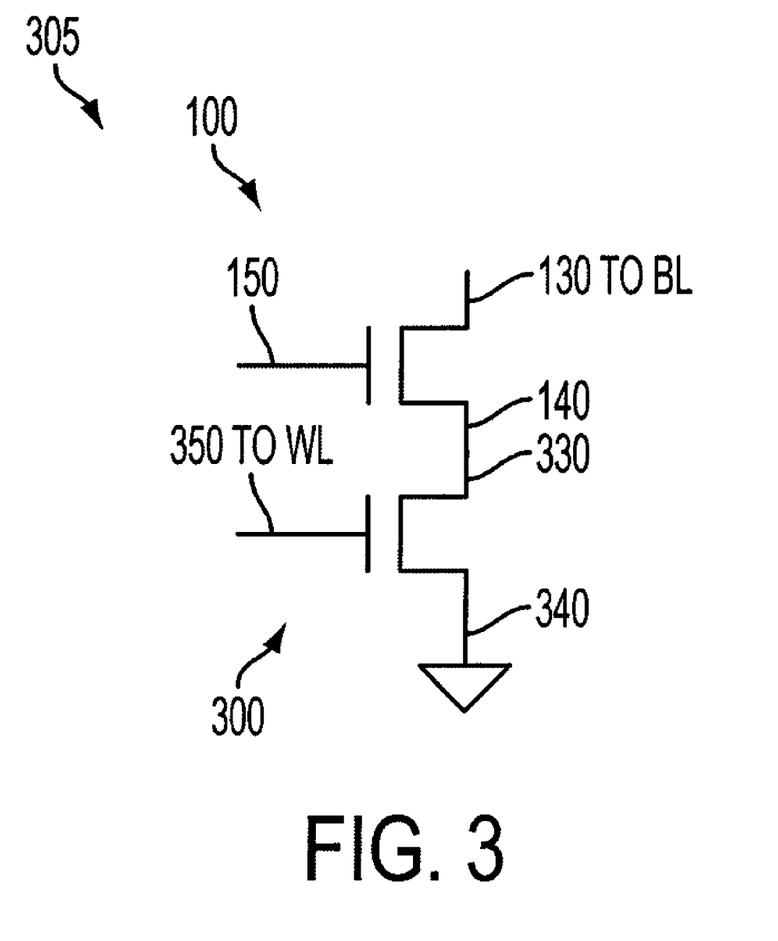
FIG. 3 is a schematic electrical diagram of a memory cell using the anti-fuse of FIG. 1 in accordance with some embodiments.

FIG. 3 shows a first embodiment of a memory cell 305 for use in a memory array (e.g., array 500 below), in accordance with some embodiments. Cell 305 includes a fuse 100 connected in series with a FinFET MOS transistor 300, both of which are shown in circuit representation. Transistor 300 includes a drain 330, a source 340 and a gate 350. Drain 130 is connected to a bit line BL. Source 140 is connected to drain 330. Gate 350 is connected to a word line WL and source 340 is grounded. Transistor 300 is also referred to herein as a selector or a selector transistor. When transistor 300 is off, it electrically isolates cell 305 from other components (e.g., of a memory array described below), but when it is on, it enables an electrical path though fuse 100 (e.g., to ground).

Applying an appropriate voltage level to word line WL and bit line BL allows accessing the status or logic level of cell 305. For example, to read cell 305, word line WL is selected, which turns on transistor 300, then bit line BL is sensed (e.g., by a sense amplifier) to detect the impedance of fuse 100. If this impedance is high, then cell 305 is high. Conversely, if this impedance is low, then cell 305 is low. To program cell 305, word line WL is selected to turn on transistor 300. Fuse 100 is then programmed as discussed above. As fuse 100 is programmed, cell 305 is programmed.

Figure 4:
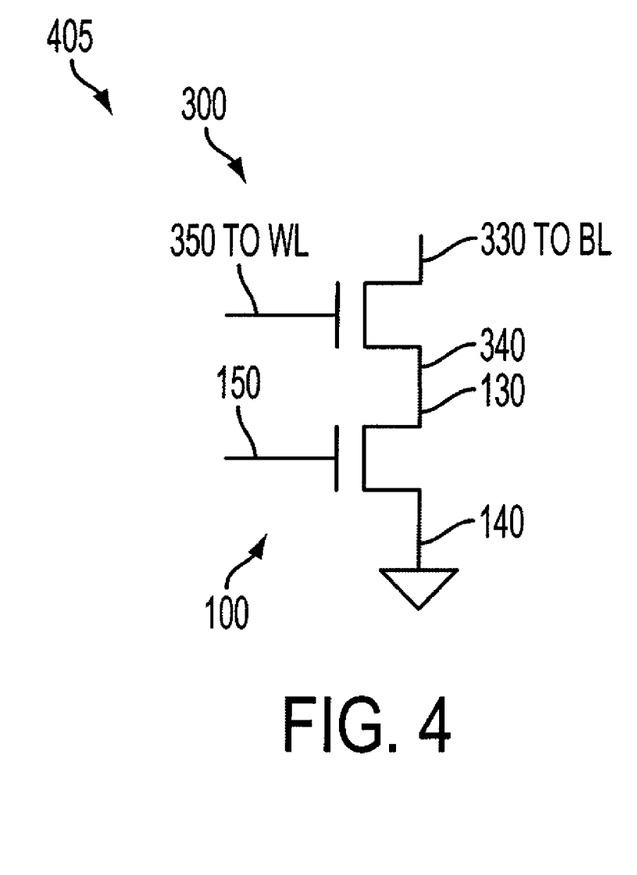
FIG. 4 is a schematic electrical diagram of a memory cell using the anti-fuse of FIG. 1 in accordance with further embodiments.

FIG. 4 shows a second embodiment of a memory cell 405 for use in a memory array (e.g., array 500, below), in accordance with some further embodiments. Cell 405 also includes a fuse 100 and a selector 300. As shown in FIG. 4, however, the position of fuse 100 and selector 300, as compared to FIG. 3, has been swapped. That is, fuse 100 is under (instead of above) selector 300. In this embodiment, when word line WL is selected, it turns selector 300 on and creates an electrical path from bit line BL to fuse 100. Similar to the operation of cell 305, when selector 300 is turned on, reading BL reveals the status or logic level of memory cell 405. If fuse 100 is open (e.g., having high impedance) then reading bit line BL reveals the high impedance of fuse 100. As a result, memory cell 405 is considered as having a high logic. Conversely, if fuse 100 is shorted (e.g., having low impedance) then reading bit line BL reveals the low impedance of fuse 100, and memory cell 405 is considered as having a low logic. To program fuse 405, word line WL is also selected to turn on selector 300 and thus creates an electrical path from bit line BL to fuse 100, and fuse 100 is programmed as explained above. Once fuse 100 is programmed, cell 405 is programmed.

In the embodiment of FIG. 4, the reading time of memory cell 405 is faster than that of cell 305 because selector 300 electrically isolates fuse 100 from other components, and, as a result, effects of parasitic capacitance of fuse 100 can be avoided.

In the embodiments of FIGS. 3 and 4, an NMOS fuse 100 and an NMOS selector 300 are shown for illustration only. Variations and modifications are within the spirit and scope of this invention. For example, a PMOS, instead of an NMOS transistor, is used as a selector in some embodiments. Further, a fuse processed by different technologies (e.g., NMOS, PMOS, etc.) is combinable with a selector processed by different technologies (e.g., NMOS, PMOS, etc.) to form a memory cell. This invention is not limited to any particular combination and/or technology.

Memory Array

Figure 5:
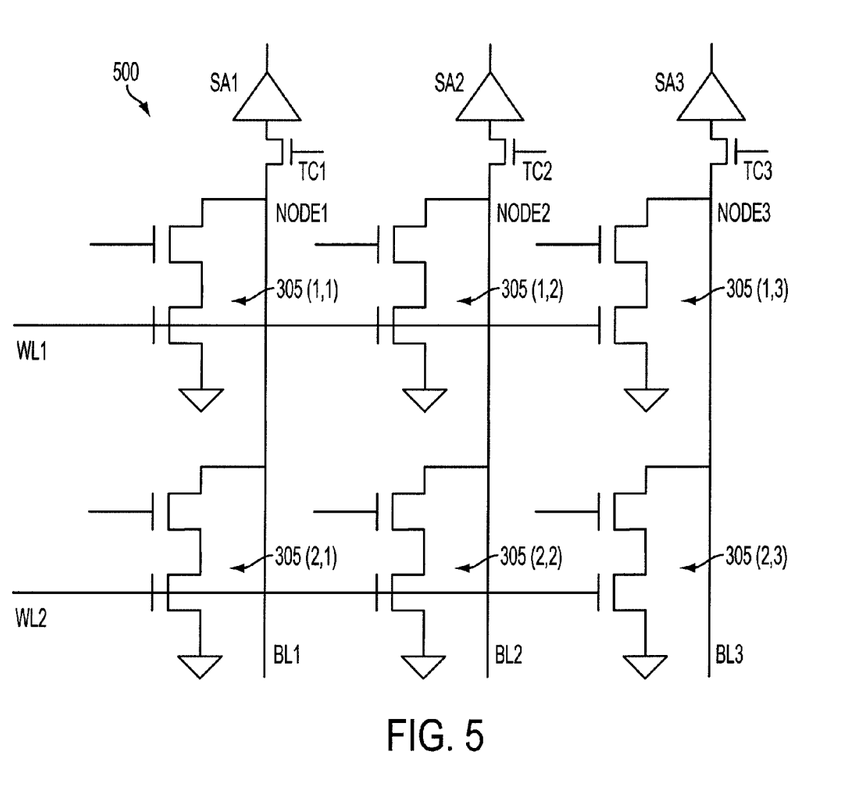
FIG. 5 is a schematic electrical diagram of a memory array using the memory cell of FIG. 3, in accordance with some embodiments.

FIG. 5 shows a memory array 500, in accordance with an embodiment. For illustration purposes, memory array 500 includes 2 rows and 3 columns and thus 6 cells 305, e.g., cells 305(1,1), 305(1,2), 305(1,3), 305(2,1), 305(2,2) and 305(2, 3). For simplicity, reference numbers for fuse 100 and transistor 300 and for each gate, drain and source of each fuse 100 and selector transistor 300 are not shown.

Sense amplifiers SA (e.g., SA1, SA2, SA3, etc) in conjunction with transistors TC (e.g., TC1, TC2, TC3) are used to read the logic level of each cell 305. In effect, sense amplifiers SA detect the impedance at nodes NODE (e.g., NODE1, NODE2, NODE3, etc.) for a corresponding cell 305. If the impedance is high, then the corresponding cell 305 is high. Conversely, if the impedance is low, then the corresponding cell 305 is low. For example, if cell 305(1,1) is selected, then a high at NODE1 indicates that cell 305(1,1) is high, and a low at NODE1 indicates that cell 305(1,1) is low, etc. For another example, if cell 305(2,1) is selected, then a high at NODE1 indicates that cell 305(2,1) is high, and a low at NODE1 indicates that cell 305(2,1) is low, etc. Further, the impedance at a node is in effect the impedance of the corresponding fuse 100 for a particular cell 305. For example, the impedance at NODE1 for cell 305(1,1) is the impedance of fuse 100(1,1). Similarly, the impedance at NODE1 for cell 305(2,1) is the impedance of fuse 100(2,1), etc. As a result, when cell 305 (1,1) is selected for reading, if fuse 100(1,1) is high impedance (e.g., fuse 100(1,1) is open), then cell 305(1,1) is high, and if fuse 100(1,1) is low impedance (e.g., fuse 100(1,1) is shorted), then cell 305(1,1) is low, etc.

To read a cell 305, a corresponding word line WL and a transistor TC are selected, and a corresponding sense amplifier SA senses the corresponding node. When a word line WL for a cell is selected (e.g., turns high), it in turn turns on the corresponding selector 300 for that particular cell. For example, to read cell 305(1,1) the corresponding word line, e.g., word line WL1, is selected, which turns on selector 300(1,1). Further, transistor TC1 is also turned on. Sense amplifier SA1 then senses the impedance at NODE1. If NODE1 is high then cell 305(1,1) is high, and if NODE1 is low then cell 305(1,1) is low. Similarly, to read cell 305(1,2), word line WL1 is selected, which turns on selector 300(1,2). Further, transistor TC2 is also turned on. Sense amplifier SA2 then senses the impedance at NODE2. If NODE2 is high then cell 300(1,2) is high, and if NODE2 is low then cell 305(1,2) is low, etc.

To program a cell 305, a corresponding word line WL is selected, and fuse 100 corresponding to that cell 305 is programmed as discussed above. For example, transistor 100 is turned off, and a voltage (e.g., $V_{PROGRAM}$) having appropriate amplitude and period is applied at the corresponding bit line BL. As a result, a current flows from the corresponding BL through the drain 130 and shorts the drain 130 and source 140 of that transistor 100. Once fuse (or transistor) 100 is programmed, the corresponding cell 305 is programmed. For example, to program cell 305(1,1), word line WL1 is selected, which turns on transistor 300(1,1). Fuse (or transistor) 100(1, 1) is turned off by having gate 150 floated or applied with a voltage less the threshold voltage $V_T$. Voltage $V_{PROGRAM}$ having an amplitude of 1.5-2V and a period of between 50-100 uS is then applied at bit line BL1, which will cause a current to flow from bit line BL1 through the drain 130 of fuse 100(1,1) and shorts drain 130 and source 140 of fuse 100(1, 1).

Those skilled in the art will recognize that word lines WL may be referred to as X-decoders while bit lines BL may be referred to as Y-decoders. Further, memory array 500 is shown to have 6 cells for illustration only, other embodiments include memory arrays having different configurations with different numbers of cells, rows and columns, and the operation of such memory arrays is apparent to a person of ordinary skill in the art from the above examples. Additionally, variations of cells 305 and 405 are used in memory arrays in accordance with one or more embodiments. The instant disclosure is not limited to any particular configuration or variation of a memory cell/array.

A number of embodiments have been described. It will nevertheless be understood that various variations and/or modifications may be made without departing from the spirit and scope of this disclosure. For example, different process technologies (MOS, NMOS, PMOS, etc.) may be used to form a fuse and different cells (e.g., cells 305, 405, or their equivalence) may be used to form a memory array having different configurations than those used as particular examples in this application.

Various method examples were described with exemplary steps, which are not necessarily performed in the order as explained. Steps may be added, replaced, changed in order, and/or eliminated as appropriate, in accordance with the spirit and scope of this invention.

Each claim of this document constitutes a separate embodiment, and embodiments that combine different claims and/or different embodiments are within the scope of the invention and will be apparent to those of ordinary skill in the art after reviewing this disclosure. Accordingly, the scope of the invention should be determined with reference to the following claims, along with the full scope of equivalences to which such claims are entitled.

What is claimed is:

1. A method comprising:
using a first terminal and a second terminal of a FinFET transistor as an anti-fuse;
controlling a gate of the FinFET transistor; and
while controlling, applying a voltage having a predetermined amplitude and a predetermined duration to the first terminal to cause the first terminal to be electrically shorted to the second terminal.

2. The method of claim 1 wherein controlling includes turning the FinFET transistor off.

3. The method of claim 1 wherein controlling includes floating the gate.

4. The method of claim 1 wherein controlling includes generating a depletion region in a substrate of the FinFET transistor.

5. The method of claim 1 wherein the first terminal is a drain of the FinFET transistor and the second terminal is a source of the FinFET transistor.

6. The method of claim 1 wherein the first terminal is a source of the FinFET transistor and the second terminal is drain of the FinFET transistor.

7. The method of claim 1 wherein controlling includes minor turning the FinFET transistor on.

8. The method of claim 1 wherein controlling includes applying to the gate a voltage less than a threshold voltage that turns on the FinFET transistor.

9. The method of claim 4 wherein the depletion region narrows a channel between the first terminal and the second terminal of the FinFET transistor.

10. A memory cell comprising:
a first transistor;
a second transistor connected in series with the first transistor;
a word line and a bit line both connected to the memory cell;
wherein
the word line controls the second transistor;
the bit line reveals a logic level of the memory cell, the memory cell having a first logic level when the first transistor is in a first state and a second logic level when the first transistor is in a second state; and
the second state is defined by a short-circuit between a drain and a source of the first transistor when a gate of the first transistor is controlled.

11. The memory cell of claim 10 wherein the first transistor comprises a FinFET transistor.

12. The memory cell of claim 10 wherein the source of the first transistor is connected to a drain of the second transistor, and the drain of the first transistor is connected to the bit line.

13. The memory cell of claim 10 wherein a source of the second transistor is connected to the drain of the first transistor, and a drain of the second transistor is connected to the bit line.

14. The memory cell of claim 10 wherein the second state is defined when the gate of first the transistor is controlled to turn off or to minor turn on the first transistor, and the drain and the source of the first transistor are electrically shorted by a voltage applied to either the drain or the source of the first transistor.

15. The memory cell of claim 10 wherein the second state is defined when the gate of the first transistor is controlled to create a depletion region in a substrate of the first transistor, and the drain and the source of the first transistor are electrically shorted by a voltage applied to either the drain or the source of the first transistor.

16. A memory array, comprising:
a plurality of memory cells arranged in at least one row and at least one column, at least one memory cell of the plurality of memory cells including a FinFET transistor and a selector coupled to the FinFET transistor;
a word line configured to control a plurality of selectors in memory cells of a row;
a bit line configured to access a plurality of FinFET transistors in memory cells of a column;
wherein
the at least one memory cell has at least two states based on impedance of the FinFET transistor of the at least one memory cell, a first state being achieved by having the FinFET transistor of the at least one memory cell unprogrammed, a second state being achieved by having the FinFET transistor of the at least one memory cell programmed; and
the FinFET transistor of the at least one memory cell is programmed by shorting a drain and a source of the FinFET transistor while a gate of the FinFET transistor is controlled.

17. The memory array of claim 16 wherein the source of the FinFET transistor of the at least one memory cell is coupled to a drain of the selector, or a source of the selector is coupled to the drain of the FinFET transistor.

18. The memory array of claim 16 wherein the impedance of the FinFET transistor of the at least one memory cell is sensed through the bit line associated with the FinFET transistor of the at least one memory cell.

19. The memory array of claim 16 wherein the gate of the FinFET transistor of the at least one memory cell is controlled by turning off the FinFET transistor or minor turning on the FinFET transistor.

20. The memory array of claim 16 wherein the gate of the FinFET transistor of the at least one memory cell is controlled by creating a depletion region in a substrate of the FinFET transistor.

21. The memory array of claim 16 wherein shorting the drain and the source of the FinFET transistor of the at least one memory cell includes applying a voltage having an amplitude and a duration to either the drain or the source of the FinFET transistor.

22. The memory array of claim 16 wherein the selector comprises a FinFET selector.

23. The memory array of claim 16 wherein the at least one memory cell is one-time programmable.

* * * * *